United States Patent [19]
Florin et al.

[11] Patent Number: 5,289,187
[45] Date of Patent: Feb. 22, 1994

[54] METHOD AND MEANS FOR CONVERTING AN ANALOG SIGNAL INTO A DIGITAL SIGNAL

[75] Inventors: Wilhelm Florin, Heideweg; Detlef Ludwig, Duisburg, both of Fed. Rep. of Germany

[73] Assignee: Krohne Mebtechnik GmbH & Co. KG, Fed. Rep. of Germany

[21] Appl. No.: 938,719

[22] Filed: Sep. 1, 1992

[30] Foreign Application Priority Data

Sep. 2, 1991 [DE] Fed. Rep. of Germany ....... 4129150
Sep. 17, 1991 [DE] Fed. Rep. of Germany ....... 4130826

[51] Int. Cl.$^5$ .............................................. H03M 1/50
[52] U.S. Cl. ........................................ 341/166; 341/168
[58] Field of Search ......................... 341/166, 167, 168

[56] References Cited

U.S. PATENT DOCUMENTS

| | | | |
|---|---|---|---|
| 4,268,820 | 5/1981 | Hareyama | 341/168 |
| 4,354,176 | 10/1982 | Aihara | 341/131 |
| 4,361,831 | 11/1982 | Grützediek et al. | 341/131 |
| 4,395,701 | 7/1983 | Evans | 341/131 |
| 4,857,933 | 8/1989 | Knight | 341/168 |
| 4,965,578 | 10/1990 | Poujois | 341/156 |
| 5,101,206 | 3/1992 | Riedel | 341/156 |

FOREIGN PATENT DOCUMENTS 3814813 5/1988 Fed. Rep. of Germany .
1434414 5/1976 United Kingdom .

OTHER PUBLICATIONS

*Technisches Messen 49 Jahrgang (1982) Heft 10* Klassifizierung der integriarenden Analog-Digital-Umsetzer by Von A. Bayati.

Primary Examiner—Marc S. Hoff
Attorney, Agent, or Firm—Cesari and McKenna

[57] ABSTRACT

Method and apparatus for converting an analog input voltage signal (preferably in the form of a low-frequency rectangular voltage) to a digital output signal proportional to the input voltage. The input voltage is integrated to the integrator voltage over a certain integration time. After the expiration of the integration time, the integrator voltage is de-integrated to zero over a de-integration time by a reference voltage and the input voltage is found from the ratio of de-integration time to integration time, multiplied by the reference voltage. During the integration time, modulation pulses, preferably derived from the reference voltage, are superimposed on the input voltage and thus the integrator voltage is influenced, so that a given integrator voltage is obtained regardless of the input voltage.

15 Claims, 3 Drawing Sheets

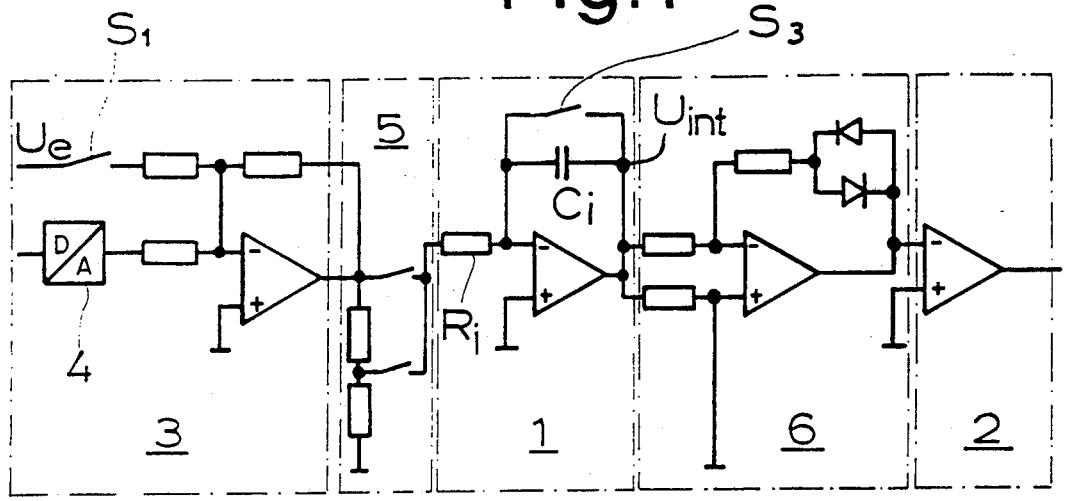
Fig. 1 PRIOR ART
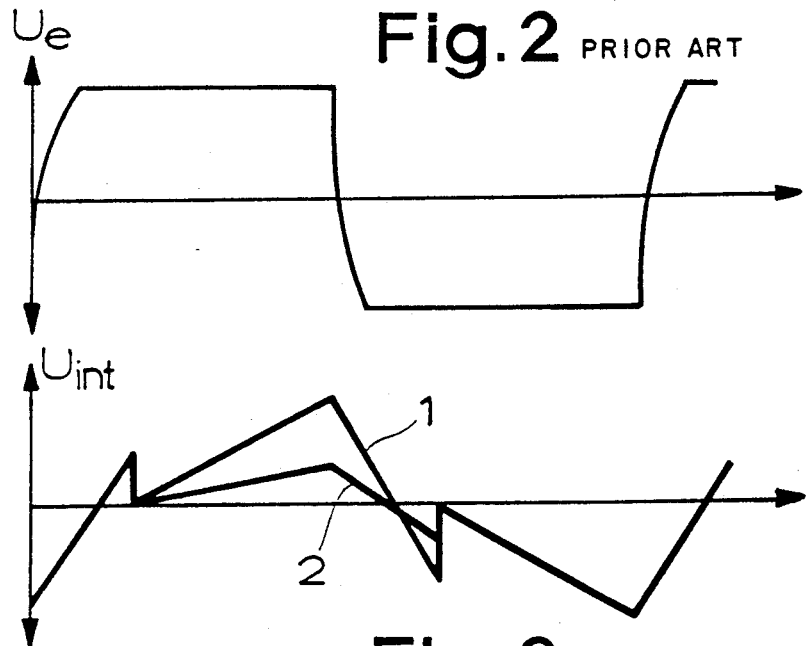
Fig. 2 PRIOR ART
Fig. 3 PRIOR ART

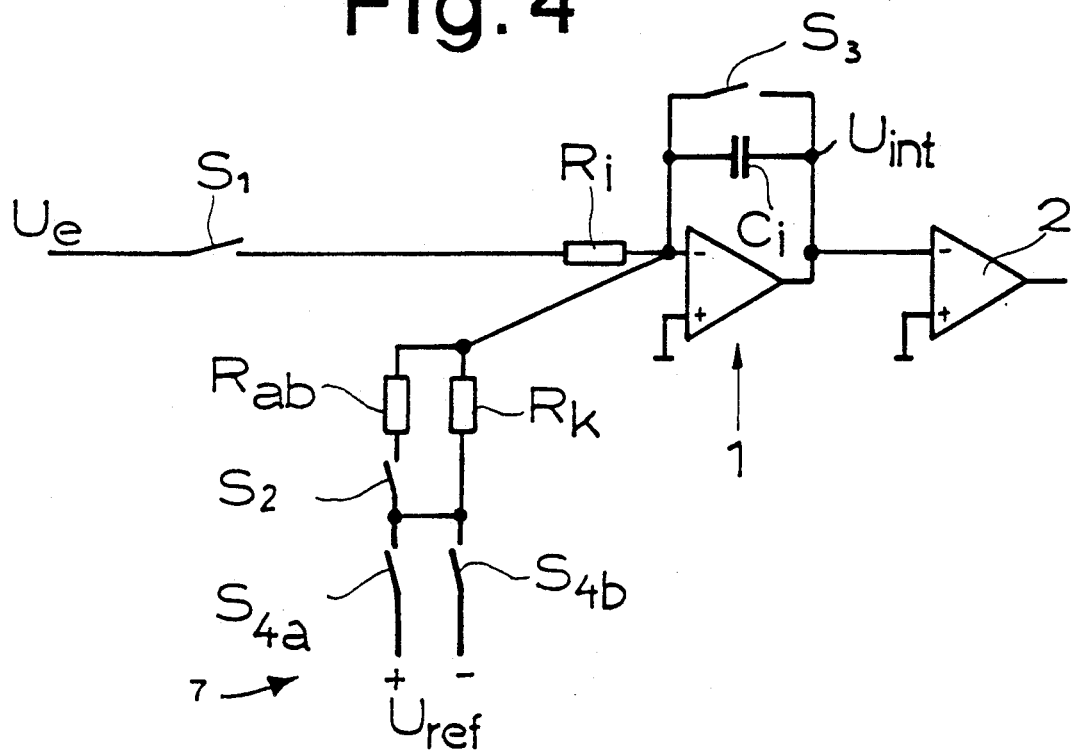
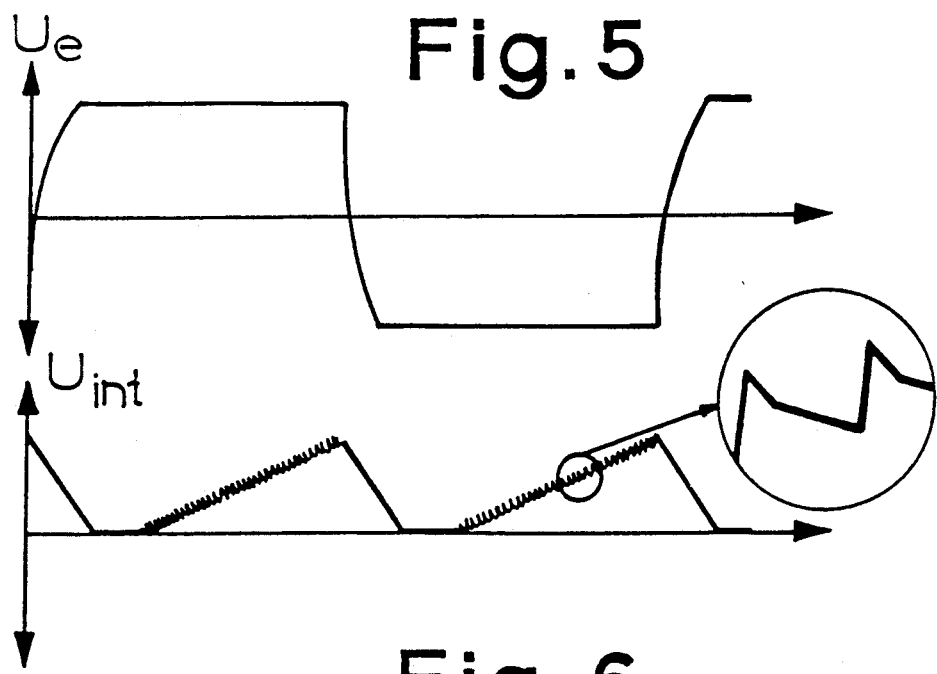

METHOD AND MEANS FOR CONVERTING AN ANALOG SIGNAL INTO A DIGITAL SIGNAL

This invention concerns a method of converting an analog signal, namely an analog input voltage (in the form of a preferably low-frequency rectangular voltage) to a digital output signal proportional to the input voltage, in which the input voltage is integrated to an integrator voltage over a given integration time. After the expiration of the integration time, the integrator voltage is de-integrated to zero by a reference voltage over a de-integration time, and the input voltage is determined from the ratio of de-integration time to integration time, multiplied by the reference voltage.

BACKGROUND OF THE INVENTION

Many methods of converting an analog signal to a digital signal are known, in particular the parallel method, the weighing method and the counting method.

In the parallel method, the input voltage is compared simultaneously with n reference voltages, and it is determined which of the two reference voltages the input voltage falls between. This gives a digital output signal proportional to the input voltage, and thus to a certain number, in one step. But this method is very expensive, since a comparator is needed for every possible number. A measuring range of 0 to 100 in steps of one thus requires n=100 comparators.

In the weighing method, the whole result is not achieved in one step. Rather, only one digit of the number is found (as a binary number). Thus, one starts with the highest digit and finds out whether the input voltage is greater or less than the reference voltage for the highest digit. If it is greater, the highest digit is set at one, and the reference voltage is subtracted. The remainder is then compared with the next-lower digit, and so on. This method thus takes as many steps as the number has digits, and just as many reference voltages.

The simplest method is the counting method. This method counts how many times the reference voltage with the lowest digit must be added to obtain the input voltage. The number of steps is the answer.

The method of converting an analog signal to a digital signal described at the beginning is a special type of counting method, namely the so-called dual slope method, which has the advantage that a very large solution can be obtained at a relatively small expense.

A known circuit arrangement for carrying out the dual slope counting method is shown in FIG. 1. That circuit includes a functionally necessary integrator 1 and a comparator 2. There is also a summation amplifier 3 with a digital-to-analog (D/A) converter 4, whose input derives from a microprocessor (not shown) and whose output constitutes a reference voltage $U_{ref}$. There is also a 10:1 divider 5, whose switches can be closed selectively, to increase the dynamic range and a ±amplifier 6, so that the comparator 2 is always driven unilaterally, and so the influence of offset and reaction times as an additive portion can be kept as constant as possible.

In the resting state of the FIG. 1 circuit, switch $S_1$ is open and switch $S_3$ is closed, and the D/A converter 4 is not driven and the integrator voltage $U_{int}$ at the output of integrator 1 is zero. When measurement starts, a counter (not shown) on the output side, which can be part of microprocessor, is reset, switch $S_3$ is open, and switch $S_1$ is closed. In this way, the input voltage $U_e$ is integrated to a certain integrator voltage $U_{int}$ over a given integration time $t_{auf}$ as measured with the counter (not shown). At the end of the integration time $t_{auf}$, the integrator voltage $U_{int}$ equals:

$$U_{int}(t_{auf}) = \frac{-1}{R_i \cdot C_i} \cdot \int_0^{t_{auf}} U_e \cdot dt \tag{1}$$

After completing the integration to the integrator voltage $U_{int}$ in the known time interval $t_{auf}$, there follows an integration down to zero voltage. For this, the integrator voltage is decremented by an integration of the reference voltage $U_{ref}$ provided by the D/A converter 4. The time required to decrement the integrator voltage $U_{int}$ down to zero volts is $t_{ab}$. This time is determined by the comparator 2 and the counter (not shown). Using comparator 2 and the counter (not shown), the decrement time $t_{ab}$ is determined as follows:

$$0 = \frac{-1}{R_i \cdot C_i} \int_0^{t_{ab}} U_{ref} \cdot dt + U_{int}(t_{auf}) \tag{2}$$

From Equation 2, the input voltage $U_e$ is found as follows:

$$U_e = \frac{t_{ab}}{t_{auf}} \cdot U_{ref} \tag{3}$$

FIG. 2 shows an input voltage Ue to be converted to a digital output signal by the FIG. 1 circuit and FIG. 3 shows integrator voltages $U_{int}$ occurring in that circuit. Note that in FIG. 3, the integrator voltage becomes negative if the time during which that voltage is decremented by $U_{ref}$ is greater than $t_{ab}$.

The advantage of the dual slope method is that neither the elementary or clock frequency, which must in any case be stable, nor the integration time-constant enter into the result. Incidentally, the momentary value of the input voltage does not enter into the result either, only its average over the integration time. Thus, the higher the frequency, the more the alternating currents are attenuated. Alternating currents whose frequencies are equal to a whole number multiple of the reciprocal value of the integration time are completely suppressed. Thus, the influence of the ripple voltage of the line frequency is eliminated by appropriate selection of the integration time.

The following disadvantages are inherent in the known dual slope counting method described thus far:

a) different input voltages lead to different modulations of the integrator (see waveforms 1 and 2 in FIG. 3);

b) a small modulation of the integrator means the saturation strength of the integrator is low;

c) small modulations of the integrator lead automatically to the problem of compensating for the direct current, so that the integrator is always driven around zero;

d) the D/A converter 4 produces different reference voltages so that linear deviations in the D/A converter enter directly into the results. Accordingly, a D/A converter with high resolution and good linearity must be used;

e) a high-precision 10:1 divider 5 is necessary to expand the dynamic range; and f) the ± amplifier 6 is necessary so that the comparator can always be driven unilaterally so that the influence of offset and reaction times can be kept as constant as possible as an additive portion.

Accordingly, it is among the objects of the invention to design and develop a method and means of converting an analog signal to a digital signal using the dual slope type of counting method, so that the method can be practiced with a simpler circuit arrangement and achieve better results.

SUMMARY OF THE INVENTION

The method and apparatus of the invention are first and foremost characterized by the fact that during the integration time, modulation pulses, preferably derive from the reference voltage, are superimposed on the input voltage and the integrator voltage is therefore influenced. At different input voltages, this always allows equal, or almost equal, modulation of the integrator. This eliminates the disadvantages connected with the different modulations of the integrator described above in the known dual slope method.

Individually, there are now various ways of designing and implementing the method of the invention, which will now be addressed by way of example.

First of all, it is recommended that in the method of the invention positive and/or negative modulating pulses be superimposed on the input voltage, depending on the need. In order to arrive, more or less, consistently at the same integrator voltage $U_{int}$, it may be necessary to work with positive modulation pulses only, negative modulation pulses only, or positive and negative modulation pulses.

In order that the work can be done "sensitively" according to the invention, modulation pulses whose pulse width is small compared to the integration time $t_{auf}$ are used. If modulation pulses with an especially small pulse width relative to the integration time are chosen, then all the modulation pulses may have the same pulse width. But then, under certain circumstances, a large number of modulation pulse is needed. Therefore, another theory of the invention is to work with modulation pulses whose pulse width is controlled. The pulse width can be controlled especially by pulse-width modulation (PWM).

Overall, then, if the number and/or polarity and/or pulse width of the modulation pulses is controlled by the method of the invention, the goal of the invention can be reached almost as precisely as desired, regardless of the input voltage $U_e$ for a given integrator voltage $U_{int}$.

According to another important aspect of the invention, the integrator pulses of known voltage and time which are superimposed on the input voltage $U_e$ and the cycle m (m being a positive integer) of integration up to $U_{int, m}$ may be calculated on the basis of the final integrator voltage $U_{int, m-1}$ which is reached in the cycle m−1 of conversion. The number and/or the polarity and/or the width of the integration pulses are chosen depending on the final integrator voltage $U_{int}$ of the preliminary conversion of the analog input voltage to a digital output signal. This, then, is iterative work.

BRIEF DESCRIPTION OF THE DRAWINGS

For a fuller understanding of the nature and objects of the invention, reference should be made to the following detailed description taken in connection with the accompanying drawings, in which:

FIG. 1, already described, is a block diagram of a circuit arrangement for a known dual slope method;

FIG. 2, already described, is a graphic representation of an input voltage to be converted into a digital output signal by the FIG. 1 circuit;

FIG. 3, already described, is a similar representation of integrator voltages occurring in the circuit arrangement in FIG. 1;

FIG. 4 is a block diagram of a circuit arrangement according to the invention for practicing the method of the invention;

FIG. 5 is a graph similar to FIG. 2 of an input voltage to be converted into a digital output signal by the FIG. 4 circuit;

FIG. 6 is a graph similar to FIG. 3 showing the integrator voltage produced in the FIG. 4 circuit.

DESCRIPTION OF THE PREFERRED EMBODIMENTS

Figure 7:
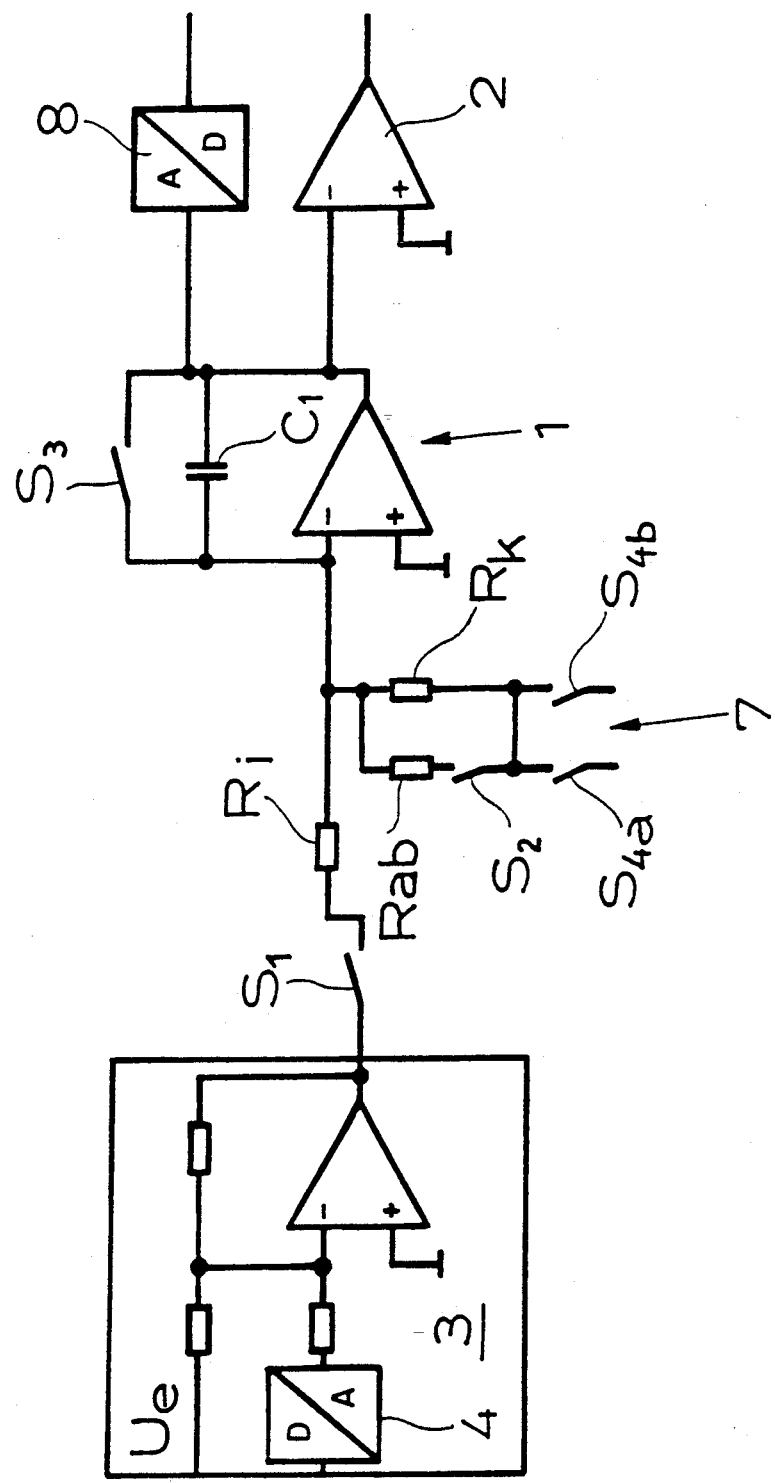
FIG. 7 is a block diagram of an expanded embodiment of a circuit arrangement according to the invention for practicing the method of the invention.

The circuit arrangements shown in FIGS. 4 and 7 for practicing the two-ramp counting method according to the invention have, in turn, an integrator 1 and a comparator 2, which are functionally necessary. There is also a modulation network 7, which has two resistors $R_{ab}$ and $R_k$ and three switches $S_2$, $S_{4a}$ and $S_{4b}$, and which is adjacent to the reference voltage $U_{ref}$ on one side and connected to the integration input of the integrator 1 on the other side.

In the embodiment depicted in FIG. 7, there are also a summation amplifier 3 as in the FIG. 1 circuit, and an A/D converter 8 which may be an inexpensive 8 bit unit. Using the summation amplifier 3, here again, direct voltage compensation can be used to further increase the dynamic range. Since the value set in several measurements is kept constant, and only the difference of two measurements is evaluated, non-linearities in the D/A converter 4 and summation amplifier 3 do not play any role. Thus, a very inexpensive D/A converter 4 with eight bits can be used here.

In the FIG. 7 circuit which includes an A/D converter 8, the integrator voltage $U_{int}$ may be measured continuously during the integration time $t_{auf}$ until the end of the integration. If during this time the integrator voltage deviates from selected points or values, the integration pulses added to the input voltage $U_e$ are further influenced. In the event of a sudden increase in the input voltage, the additional influence prevents the integrator 1 from being overloaded. If there is a sudden decrease in the input voltage, the additional influence results in the integrator being loaded relatively high. Altogether, the objective is to provide a constant, or nearly constant, loading of the integrator 1.

We will now describe the method of the invention using the FIGS. 4 and 7 circuit arrangements.

In the resting state, switches $S_1$, $S_2$, $S_{4a}$ and $S_{4b}$ are open, and switch $S_3$ is closed; the integrator voltage $U_{int}$ is zero. When measurement starts, a counter on the output side (not shown) which can be part of a microprocessor, is reset, switch $S_3$ is opened and switch $S_1$ is closed. During the integration time now beginning, the switches $S_{4a}$ and $S_{4b}$ are opened and closed under the control of the microprocessor (not shown) so that the modulation pulses, preferably derived from the reference voltage $U_{ref}$, are superimposed on the input voltage $U_e$. The switches are controlled to provide constant, or nearly constant, loading of the integrator 1 as just described. At the end of the integration time $t_{auf}$, switch $S_1$ is opened.

Then, switches $S_2$ and $S_{4b}$ are closed to commence the de-integration step. During the de-integration time $t_{ab}$, the integrator voltage $U_{int}$ is de-integrated to zero. The resulting integrator voltage $U_{int}$ for the FIG. 4 circuit is shown in FIG. 6. Following Equations 1 to 3, the input voltage $U_e$ may then be calculated as follows:

$$U_e = \frac{U_{ref} \cdot t_{ab} \cdot \frac{1}{R_{ab} \| R_k} - U_{ref} \cdot (t_{S4a} - t_{S4b}) \cdot n \cdot \text{cycles} \cdot \frac{1}{R_k}}{t_{auf} \cdot \frac{1}{R_i}} \qquad (4)$$

It will thus be seen that the objects set forth above, among those made apparent from the preceeding description, are efficiently attained and, since certain changes may be made in the above constructions and in carrying out the above method without departing from the scope of the invention, it is intended that all matter contained in the above description or shown in the accompanying drawings be interpreted as illustrative and not in a limiting sense.

It is also to be understood that the following claims are intended to cover all of the generic and specific features of the invention described herein.

We claim:

1. In a method for converting an analog input voltage signal (preferably in the form of a low-frequency rectangular voltage) to a digital output signal proportional to the input voltage, in which the input voltage is integrated to an integrator voltage over a predetermined integration time and, after the expiration of the predetermined integration time, the integrator voltage is de-integrated to zero over a de-integration time by a reference voltage and the input voltage is found from the ratio of the de-integration time to the integration time, multiplied by the reference voltage, the additional step of superimposing modulation pulses, preferably derived from the reference voltage, on the input voltage during the integration time so as to influence the integrator voltage in such a way that even at different input voltages, substantially equal modulation of the integrator is achieved.

2. The method according to claim 1, wherein positive and/or negative modulation pulses are superimposed on the input voltage.

3. The method according to claim 1 or 2, including the step of controlling the pulse width of the modulation pulses.

4. The method according to claim 3, including the step of controlling the pulse width of the modulation pulses by pulse-width modulation.

5. The method according to claim 1 or 2, including the step of controlling the number and/or the polarity and/or the pulse width of the modulation pulses.

6. In a circuit for converting an analog input voltage signal (preferably in the form of a low-frequency rectangular voltage) to a digital output signal proportional to the input voltage, in which the input voltage is integrated to an integrator voltage over a predetermined integration time and, after the expiration of the predetermined integration time, the integrator voltage is de-integrated to zero over a de-integration time by a reference voltage and the input voltage is found from the ratio of the de-integration time to the integration time, multiplied by the reference voltage, the improvement comprising means for producing modulation pulses from the reference voltage and means for superimposing the modulation pulses on the input voltage during the integration time so as to influence the integrator voltage in such a way that even at different input voltages, substantially equal modulation of the integrator is achieved.

7. The circuit according to claim 6, wherein the modulation pulses are positive and/or negative pulses.

8. The circuit according to claim 6, and further including means for controlling the pulse width of the modulation pulses.

9. The circuit according to claim 6, and further including means for controlling the number and/or the polarity of the modulation pulses.

10. In a method for converting an analog input voltage signal (preferably in the form of a low-frequency rectangular voltage) to a digital output signal proportional to the input voltage, in which the input voltage is integrated to an integrator voltage over a given integration time and, after the expiration of the integration time, the integrator voltage is de-integrated to zero over a de-integration time by a reference voltage and the input voltage is found from the ratio of the de-integration time to the integration time, multiplied by the reference voltage, the additional steps of superimposing modulation pulses, preferably derived from the reference voltage, on the input voltage during the integration time, thereby influencing the integration voltage so that even at different input voltages, substantially equal modulation of the integrator is achieved, controlling the number and/or the polarity and/or the pulse width of the modulation pulses, and controlling in the mth conversion, m being a positive integer, the number and/or the polarity and/or the pulse width of the modulation pulses as a correlation of what magnitude integrator voltage was achieved in the m−1th conversion.

11. The method according to claim 10 wherein positive and/or negative modulation pulses are superimposed on the input voltage.

12. In a method for converting an analog input voltage signal (preferably in the form of a low-frequency rectangular voltage) to a digital output signal proportional to the input voltage, in which the input voltage is integrated to an integrator voltage over a given integration time and, after the expiration of the integration time, the integrator voltage is de-integrated to zero over a de-integration time by a reference voltage and the input voltage is found from the ratio of the de-integration time to the integration time, multiplied by the reference voltage, the additional step of superimposing modulation pulses, preferably derived from the reference voltage, on the input voltage during the integration time, thereby influencing the integrator voltage so that even at different input voltages, substantially equal modulation of the integrator is achieved, measuring the integrator voltage constantly over the integration time, and then, if the integrator voltage deviates from selected default values during the integration time, influencing the modulation pulses so that a given voltage area is produced.

13. The method according to claim 12 wherein positive and/or negative modulation pulses are superimposed on the input voltage.

14. In a circuit for converting an analog input voltage signal (preferably in the form of a low-frequency rectangular voltage) to a digital output signal proportional to the input voltage, in which the input voltage is integrated to an integrator voltage over a given integration time and, after the expiration of the integration time, the integrator voltage is de-integrated to zero over a de-integration time by a reference voltage and the input voltage is found from the ratio of the de-integration time to the integration time, multiplied by the reference voltage, the improvement comprising means for producing modulation pulses from the reference voltage, means for superimposing the modulation pulses on the input voltage during the integration time, thereby influencing the integrator voltage so that even at different input voltages, substantially equal modulation of the integrator is achieved, and means for controlling in the mth conversion, m being a positive integer, the number and/or the polarity and/or the pulse width of the modulation pulses as a correlation of what magnitude integrator voltage was achieved in the m−1th conversion.

15. In a circuit for converting an analog input voltage signal (preferably in the form of a low-frequency rectangular voltage) to a digital output signal proportional to the input voltage, in which the input voltage is integrated to an integrator voltage over a given integration time and after the expiration of the integration time, the integrator voltage is de-integrated to zero over a de-integration time by a reference voltage and the input voltage is found from the ratio of the de-integration time to the integration time, multiplied by the reference voltage, the improvement comprising means for producing modulation pulses from the reference voltage, means for superimposing the modulation pulses on the input voltage during the integration time, thereby influencing the integrator voltage so that even at different input voltages, substantially equal modulation of the integrator is achieved, means for measuring the integrator voltage constantly over the integration time, and means for influencing the modulation pulses so that a given voltage area is produced if the integrator voltage deviates from selected default values during the integration time.

* * * * *